United States Patent [15] 3,699,919

Coffman [45] Oct. 24, 1972

[54] APPARATUS FOR LEVELING SOLDER IN HOLES OF PRINTED CIRCUIT BOARDS

[72] Inventor: Frederick E. Coffman, State College, Pa.

[73] Assignee: Chemcut Corporation, State College, Pa.

[22] Filed: March 16, 1971

[21] Appl. No.: 124,804

[52] U.S. Cl. ....................................118/56, 118/425
[51] Int. Cl. ............................................B05c 11/12
[58] Field of Search ..........................118/423, 52–57, 118/425; 117/101

[56] References Cited

UNITED STATES PATENTS 2,369,155 2/1945 Marinsky et al. .......117/101 X
2,792,810 5/1957 Maconeghy et al......118/52 X

*Primary Examiner*—Morris Kaplan
*Attorney*—Paul & Paul

[57] ABSTRACT

Apparatus for heating printed circuit boards to melt solder overlay and, while solder overlay is in melted condition, orbiting the board rapidly in its plane to level solder on the interior sidewalls of the terminal holes. The circuit board is held on a planar member which is mounted by eccentric bearings on a shaft or shafts symmetrically disposed and driven in unison by timing pulleys and a timing belt. Preferably, a melted liquid bath is used to heat the circuit board, which is immersed in the bath then removed to cool. To facilitate loading and unloading, the circuit board is preferably mounted on a planar mounting member which is rotatable so that the circuit board is below the mounting member during the heating and solder leveling operation but which can be rotated so that the circuit board is above the planar mounting member for loading and unloading. Preferably also, the flexible shafts further include counterweights to balance the inertia of the circuit board and planar mounting member during its circular movement.

11 Claims, 7 Drawing Figures

INVENTOR.
Frederick E. Coffman
BY
Paul + Paul
ATTORNEYS.

INVENTOR.
Frederick E. Coffman
BY
Paul & Paul
ATTORNEYS.

INVENTOR.
Frederick E. Coffman
BY
Paul & Paul
ATTORNEYS.

INVENTOR.
Frederick E. Coffman
BY
Paul & Paul
ATTORNEYS.

APPARATUS FOR LEVELING SOLDER IN HOLES OF PRINTED CIRCUIT BOARDS

The present invention pertains to an apparatus for leveling the solder on the interior sidewalls of terminal holes in printed circuit boards having a solder overlay. More particularly, this invention pertains to a practical and effective apparatus for performing this operation on an industrial scale.

Spinning a printed circuit board with a melted solder overlay thereon to remove excess solder is disclosed in U.S. Pat. No. 3,359,132-Wittmann. Moving a plurality of objects to be coated on their interior sidewalls through a circular path in a plane generally perpendicular to the walls to be coated is shown in U.S. Pat. No. 2,130,545-Heath. In the Heath apparatus, bulbs to be silvered are mounted on a member which is driven through eccentric bearings by rectangularly disposed shafts driven in unison by timing pulleys and a timing belt. Finally, rapidly moving a printed circuit board through a small diameter circular path, while a solder overlay thereon is in a melted condition, to level the solder on the interior sidewalls of terminal holes in the printed circuit board has been proposed by others, although to the present inventor's knowledge, such proposals or suggestions are not found in any printed publication and have not been either publicly or commercially used or publicly disclosed.

While the apparatus of the above cited patents is assumed to be effective for the purposes to which the respective devices are directed, these devices are inherently unsuitable for the purpose to which the present invention is directed. For example, the Wittman apparatus does not subject melted solder in randomly disposed terminal holes on the printed circuit board to uniform centrifugal force. Rather, the centrifugal force of the Wittman apparatus will vary with the location of the holes on the board.

The Heath apparatus, which utilizes rigid shafts for support and transmission of motion to the mounting member, is thought to be impractical for the present purpose. Since the products to be coated in the Heath apparatus are relatively large, the circular movement is of relatively large diameter and the speed of movement is apparently not critical. Load imbalances and minimization of extraneous motion, which are critical in smaller diameter and higher speed orbiting movement, are therefore not provided for by Heath.

Finally, to the extent a method similar to that utilized in the operation of the apparatus of the present invention has previously been proposed by others, the apparatus used to demonstrate the feasibility thereof has been limited to laboratory-type apparatus, such as an orbital sander on which the circuit board is mounted and heated. Such apparatus is not thought to be practical for industrial use.

There remains the need therefore for an effective and practical form of apparatus which may be loaded and unloaded quickly and efficiently and which, with a minimum of care and manual operations, will heat the solder overlay of a printed circuit board and while in that heated condition move the circuit board rapidly in a small circular path in the plane thereof.

It is a general object of the present invention to provide such an apparatus and in particular to provide such an apparatus which may be operated economically for long periods of time with a minimum of care and maintenance.

These and other objects, which will become apparent in the course of the subsequent discussion, are met by the present invention, which comprises, briefly, an apparatus with a planar mounting member for the circuit board, which mounting member is supported through eccentric bearings by at least one symmetrically disposed flexible shaft rotated in unison. The apparatus also includes means for heating the circuit board both prior to and during the circular motion and preferably further includes counterweights to balance the inertia of the planar mounting member and the circuit board mounted thereon. In the preferred embodiment of the present invention, four rectangularly disposed flexible shafts are used and rotational means are provided to permit rotation of the planar mounting member and the circuit board mounted thereon from a loading and unloading position in which the board is above the mounting member to a heating and solder leveling position in which the circuit board is below the planar mounting member.

This invention may be better understood from the following detailed description thereof taken in conjunction with the appended claims and the accompanying drawings in which:

Figures 1, 2:
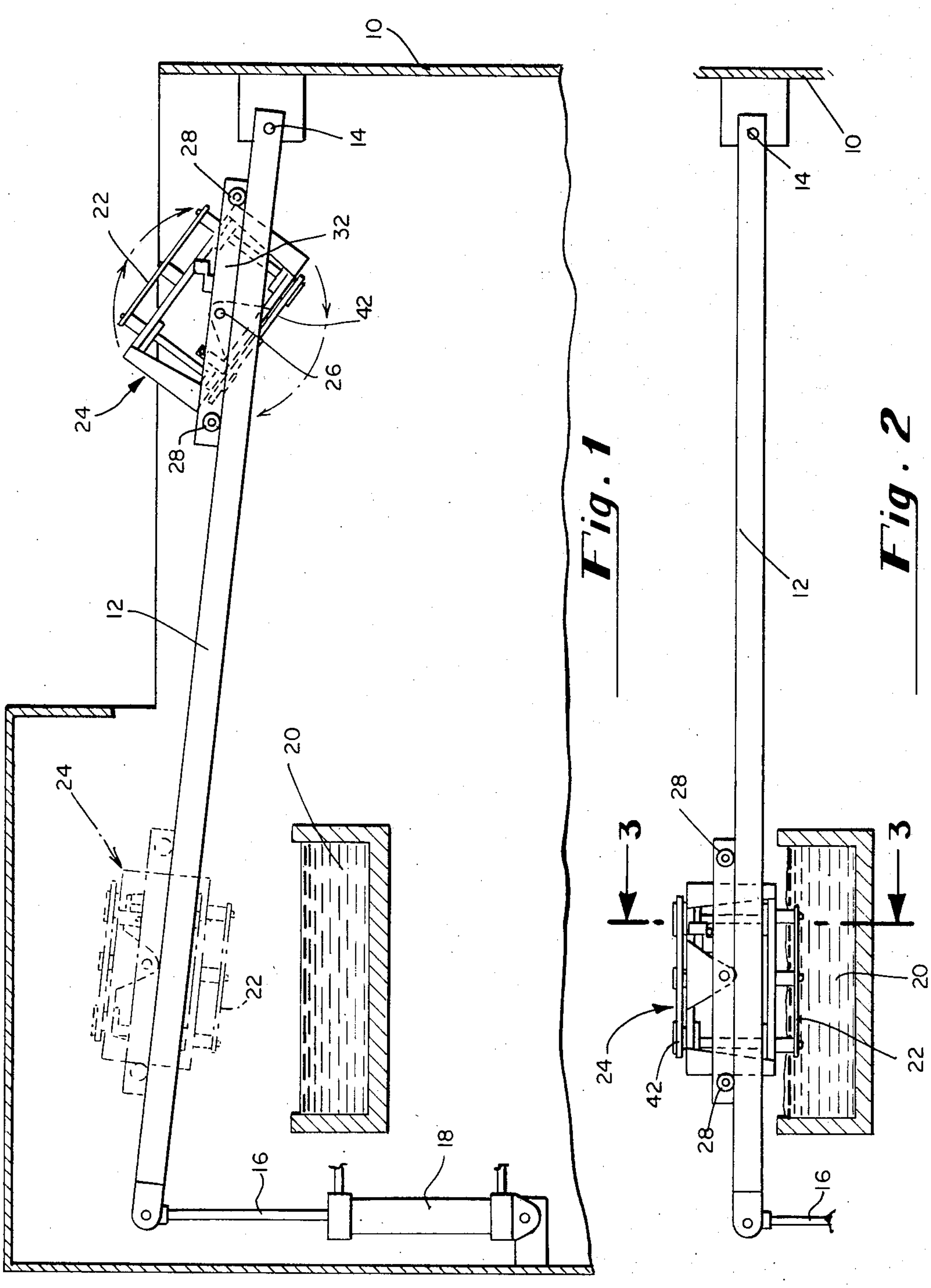
FIG. 1 is a side view, partially in section, of the preferred form of the present invention, showing particularly the motions for loading and unloading and preparing for solder leveling.
FIG. 2 is a partial side view, partially in section, showing the apparatus of FIG. 1 in a specific stage of the operation thereof.

Referring more specifically to FIG. 1, there is shown apparatus enclosure 10 and carriage rail 12, suspended between a pivot mount 14 and a vertically actuable piston connecting rod 16, which is in turn connected to hydraulic cylinder 18 attached to apparatus enclosure 10. A melted paraffin bath 20 is provided to heat circuit board 22 mounted on carriage 24 which is adapted to rotate about pivot 26 from the loading position shown in FIG. 1 toward the operating position of the apparatus. To place circuit board 22 in the operating position it is first rotated about carriage pivot 26 and then rolled along carriage rail 12 on rollers 28 to the position shown by phantom lines in FIG. 1. Hydraulic cylinder 18 is then actuated to lower one end of carriage rail 12, thereby placing circuit board 22 in melted paraffin bath 20, as shown in FIG. 2.

Figure 3:
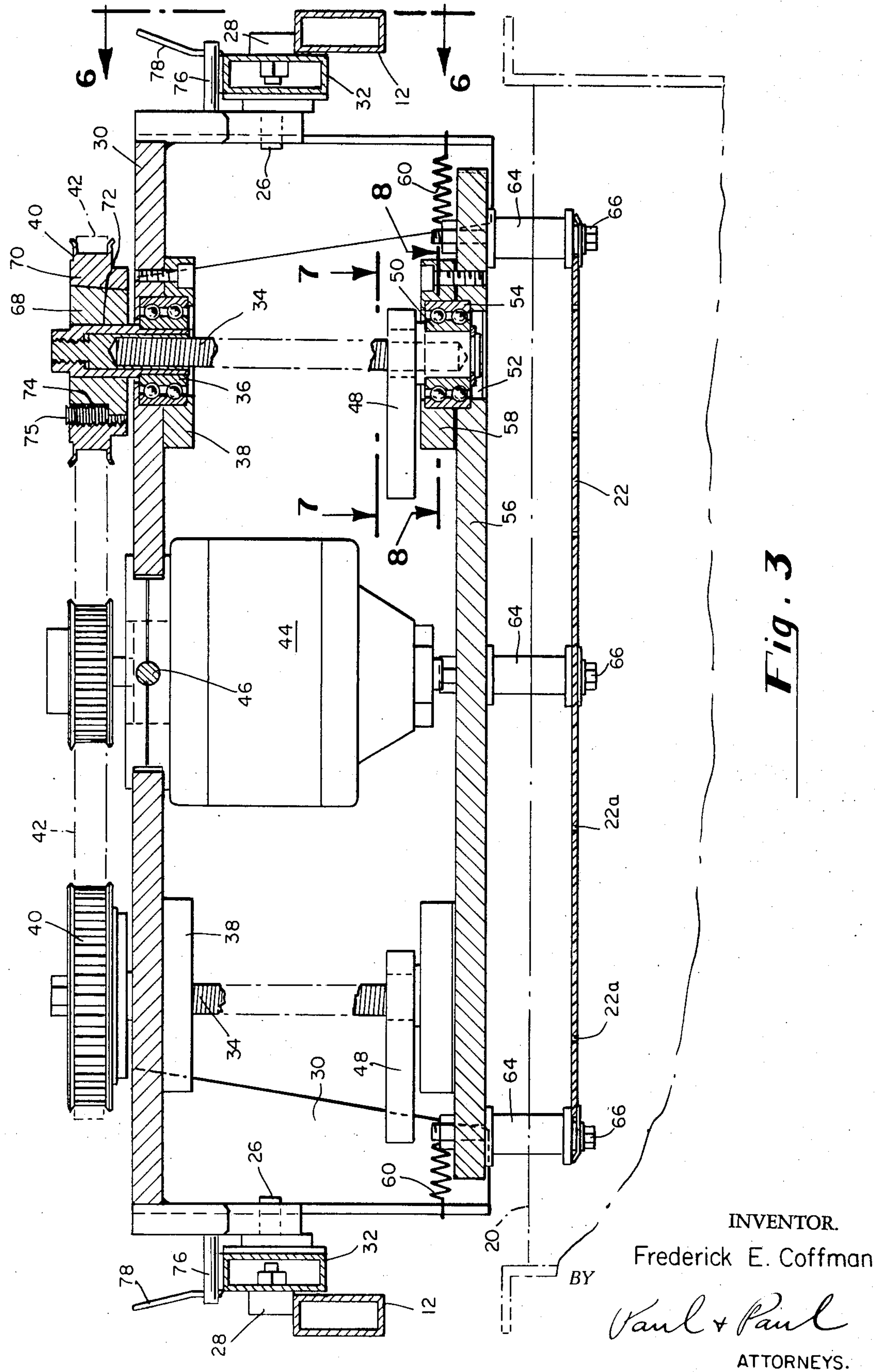
FIG. 3 is a front sectional view of the carriage of the apparatus shown in FIGS. 1 and 2, showing particularly the shafts and bearings utilized in the motion translation means of the present invention.
Figure 4:
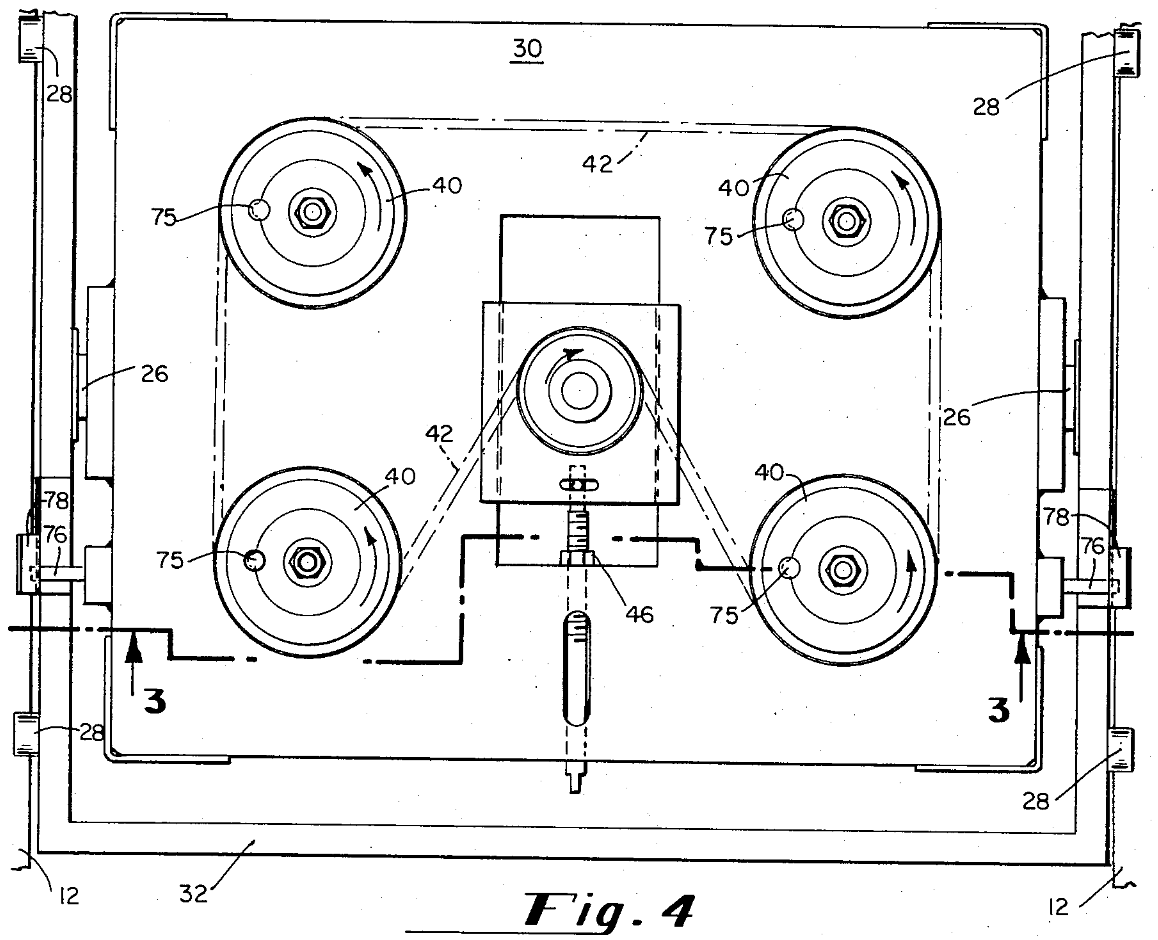
FIG. 4 is a top view of the carriage and rotational motion imparting means used in the apparatus shown in FIGS. 1 and 2.

FIG. 3 is a sectional view, taken along the line 3—3 of FIG. 2, of carriage 24, showing some of the details thereof, including some of the mounting and operating mechanisms used in the apparatus shown in FIGS. 1 and 2. In FIG. 3, carriage body 30 pivotally connected through carriage pivot 26 to carriage frame 32 is shown. Connected to carriage frame 32 are carriage rollers 28 supported on carriage rails 12. Flexible shafts 34 are rotated in bearings 36 and bearing retainers 38 by means of their connection to timing pulleys 40, which are in turn driven by timing belt 42 driven by a centrally disposed motor 44. The position of motor 44 may, although it need not necessarily be adjustable to govern timing belt tension. In the form of the invention shown, this adjustment is made using shaft and nut 46.

At its end opposite timing pulley 40, flexible shaft 34 is attached to counterweight 48 and to the inner race 50 of bearing set 52 which otherwise includes outer race 54. Bearing set 52 is held on planar mounting member 56 by bearing retainer 58. Flexible shaft 34 is non-concentric with respect to bearing set 52, i.e. the center line of flexible shaft 34 is slightly displaced from the center of bearing set 52, in an amount equal to the radius of the intended circular path of planar mounting member 56, generally 0.03–0.125 inches. Springs 60 may be, although they need not necessarily be suspended between planar mounting member 56 and carriage body 30 perpendicular to the side walls thereof at each of the corners of the planar mounting members 56 in order to urge planar mounting member 56 toward the center of its intended circular path.

Projecting from adjustment slots 62 in planar mounting member 56 are circuit board holding members 64 to which circuit board 22 is attached by bolts 66. Terminal holes 22*a* are seen in circuit board 22.

The angular displacement of the axis of flexible shaft 34 from the center of bearing set 52 must be the same for each of the shafts 34 and bearing set 52 combinations. In order to set and maintain this precise alignment and also to remove timing pulleys 40 as necessary, for set up or otherwise, timing pulleys 40 consist of an inner ring 68 which mates with an outer ring 70 at a sloped sidewall interface 72 having a set screw hole 74 therein. As seen in FIG. 3, set screw hole 74 is bottomed midway through inner ring 68 so that set screw 75 upon contacting the hole bottom in inner ring 68 tends to pull up outer ring 70 with further tightening of set screw 75 thereby insuring good frictional contact between inner ring 68 and shaft end 34 at interface wall 72 so that the components of timing pulley 40 will thereafter function as a unit.

Figure 6:
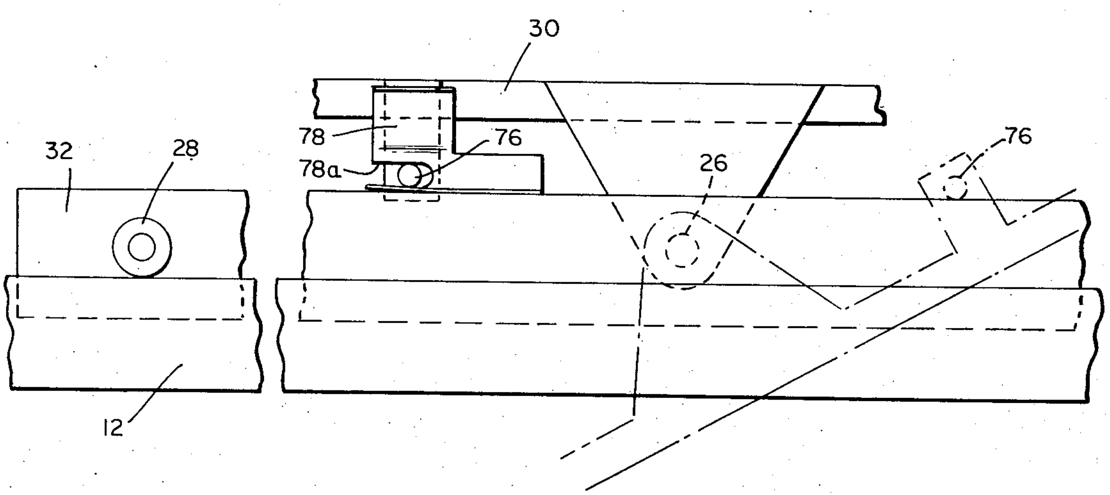
FIG. 6 is an enlarged detailed view of the carriage rotating and sliding means which permits the carriage movement from the loading position to the operating position and back.

As shown in FIG. 6, carriage 24 is locked on carriage frame 32 after being pivoted into the operating position by means of locking posts 76 projecting from carriage body 30 and mating with spring loaded clips 78 mounted on carriage frame 32 and having slots 78a for receiving locking post 76.

Figure 8:
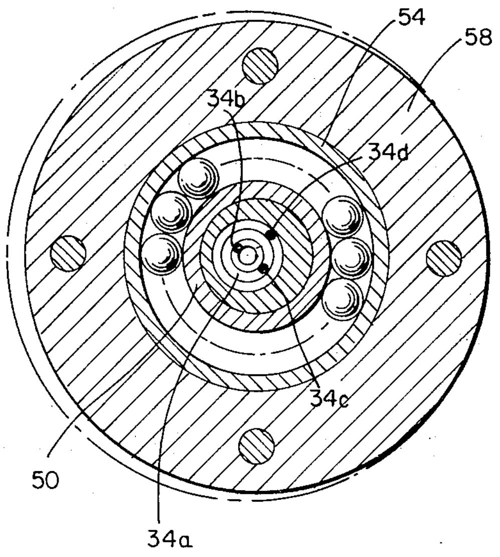
FIGS. 7 and 8 are enlarged detail views showing the shaft, eccentric bearing, and bearing retainer utilized in the apparatus shown in FIGS. 1–6.
Figure 7:
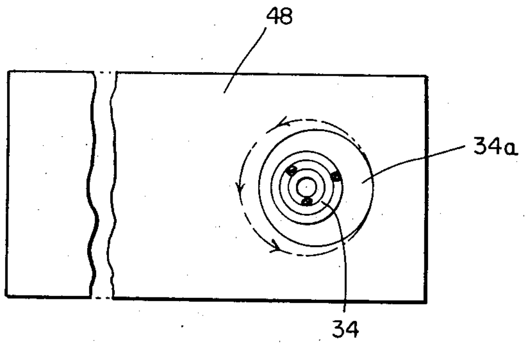
Figure 5:
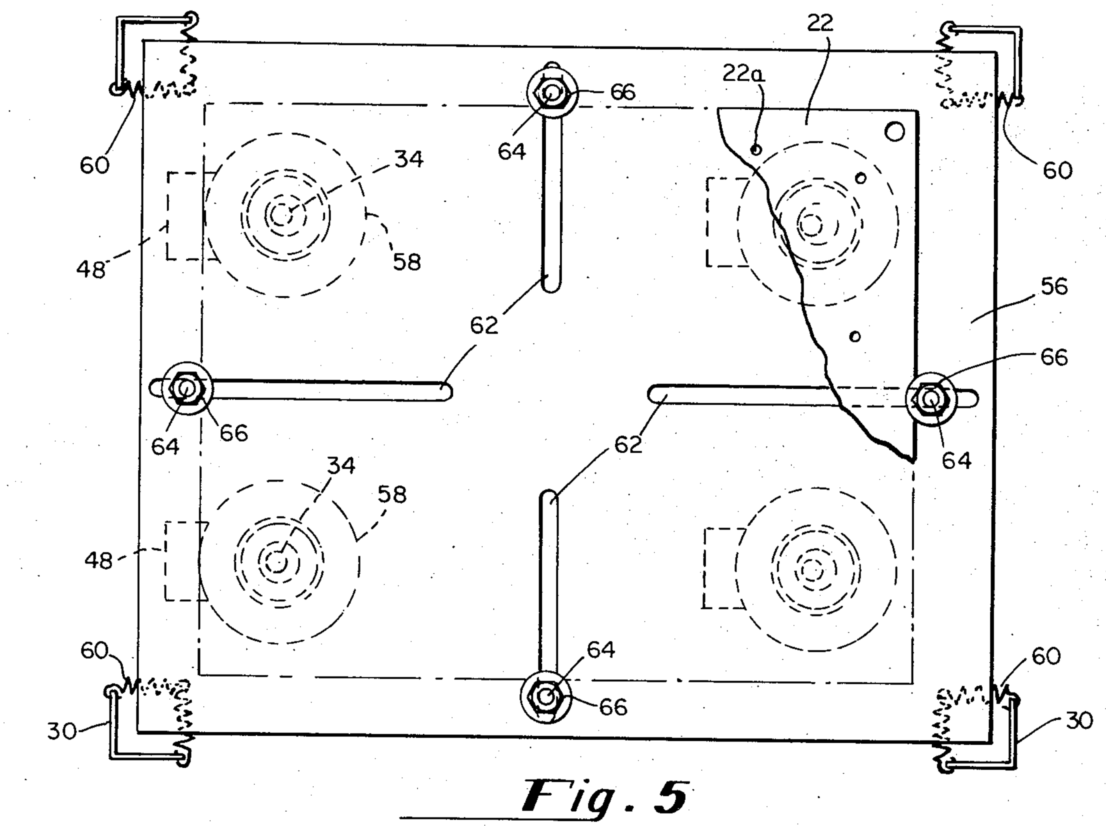
FIG. 5 is a bottom view of the carriage shown in FIG. 4.

In the detail views of FIGS. 7 and 8 there are shown counterweight 48 and shaft 34 and shaft terminus 34a, in which the axis of shaft 34 is seen to be non-coincident with the center of shaft terminus 34a and is in fact displaced therefrom in the same direction as the displacement therefrom of the center of gravity of counterweight 48.

In FIG. 8, flexible shaft 34, which in this embodiment consists of a plurality of concentric coil windings, having termini shown in section, 34*b*, 34*c*, and 34*d*, is non-concentrically fixed in shaft terminus 34*a* which is in turn mounted in inner race 50 mated with outer race 54 and held in place by bearing retainer 58, the displacement of which with rotation of shaft 34 is shown by phantom lines in FIG. 8. Obviously other means may be substituted for transposing the rotational motion of flexible shafts 34 to circular motion of planar mounting member 56. For example, a cam or roller with appropriate track therefor may be substituted.

Generally speaking, in order to level solder on the interior sidewalls of the very small holes in printed circuit boards, the apparatus of this invention must be adapted to move the planar mounting member and the circuit board mounted thereon in a circular path having a small diameter, generally on the order of ¼ – 1/16 inches and at a rate of from 1,000 to 10,000 rpm. Other heating means may of course be substituted for the paraffin bath and various other alternatives in the design details of the present invention are also possible.

In the operation of the apparatus of the preferred form of the present invention, a circuit board is first attached to board holding members 64 of planar mounting member 56 while carriage 24 is in the loading position, i.e. board holders 64 are above planar mounting member 56. Carriage 24 is then rotated and locking posts 76 are engaged in locking post slots 78*a* of the spring loaded clips 78 mounted on carriage frame 32. Carriage frame 32 is then rolled along carriage rails 12 so that it is suspended over the heating means, namely the paraffin bath 20. Cylinder 18 is actuated to lower circuit board 22 either into or just above paraffin bath 20. In one mode of operation of the apparatus of the present invention, circuit board 22 is immersed in the paraffin bath 20 and shafts 34 are rotated for about 10 seconds. Circuit board 22 is then raised just above the surface level of the paraffin bath and shafts 34 are again rotated, this time for about 20 seconds. Rotation of shafts 34 may of course be continuous through this immersion and post immersion heating step. Carriage rails 12 are then raised by cylinder 18 and rolled back to the loading-unloading position where spring loaded clips 78 are pressed outwardly to release locking posts 76 and permit carriage 24 to be rotated approximately 150° into the loading-unloading position. Circuit board 22 is then removed and the cycle is repeated.

In another alternative embodiment of the present invention, carriage rails 12 are pivoted at an intermediate point between pivot point 14 and the connection with piston rods 16 so that carriage 24 may be raised and lowered vertically into and out of paraffin bath 20. In this fashion circuit board 22 may be maintained at a horizontal position when disposed just above the surface level of bath 20 as well as when it is immersed in paraffin bath 20.

Among the many desirable features of the apparatus of the present invention, including the facility with which the apparatus may be set up, loaded and unloaded, and operated, there is the primary feature that due to the provision of flexible shafts 34 minor vibrations and other extraneous movements of planar mounting member 56 and circuit board 22 are isolated from timing pulleys 40, timing belt 42, etc. and vice versa. Thus the movement imparted to circuit board 22 is substantially planar circular movement. Solder leveling is therefore optimized and possible damage to the circuit board and to the apparatus itself is therefore minimized. Springs 60 urging planar mounting member 56 towards the center of its circular movement and counterweights 48 contribute to this isolating effect and also minimize the introduction of extraneous movements due to inertia and unbalanced load forces. Friction pads located at the corners of member 56 may also be used for this purpose and springs 60 may be omitted.

Finally, the use of flexible shafts 34 permits a slight displacement of shafts 34 at their ends near planar mounting member 56 in order to provide further compensation for slight imbalances in the load. It should be emphasized however that generally flexible shafts 34 are not intended to be displaced from their center line. Rather, because of the bending movement of flexible shafts 34 relative to the mass of the load, which includes planar mounting member 56, bearing set 52, bearing retainer 58, circuit board holding member 64, and circuit board 22, the eccentric position of the axes of shafts 34 in bearing sets 52 tend to throw planar mounting member 56 and circuit board 22 in a circular path as shafts 34 rotate. Thus the rotational movement of shafts 34 is effectively and efficiently translated into circular planar movement of planar mounting member 56 and circuit board 62 with a minimum of extraneous movements and damage, thus optimizing the solder leveling effect of the apparatus of the present invention.

Any number of flexible shafts may be used instead of the four rectangularly displaced shafts used in the illustrated and preferred form of this invention. Whether one or more shafts are used, they must of course be placed symmetrically with respect to the movement of the motion imparting means and the planar mounting member.

As will be obvious to those skilled in the art various other minor modifications and alternative embodiments in addition to those disclosed herein but still within the spirit and scope of the present invention are possible. The appended claims are intended to cover all such numerous possible obvious modifications and embodiments.

What is claimed is:

1. Apparatus comprising a. a planar mounting member with means to retain a printed circuit board at a fixed distance therefrom, b. a plurality of flexible shafts disposed perpendicularly with respect to said planar mounting member and symmetrically with respect to said planar mounting member, c. means for rotating said shafts about their respective axes at a controlled rate, d. means for transposing the rotational motion of said shafts into non-rotating circular movement of said planar member in its plane, and e. means for supplying heat to a circuit board mounted on said planar mounting member during said circular movement thereof.

2. Apparatus, as recited in claim 1, wherein said flexible shafts comprise rectangularly disposed flexible shafts.

3. Apparatus, as recited in claim 1, wherein said shaft rotating means comprises timing pulleys mounted on one end of each of said shafts and a timing belt driving each of said pulleys, said timing belt being driven by a motor centrally disposed with respect to said shafts, said motor having a timing pulley on the shaft thereof.

4. Apparatus, as recited in claim 1, further including counterweights mounted on each of said shafts near said planar mounting member, the centers of gravity of said counterweights being displaced from the respective axis of the shaft on which each of said counterweights is mounted in a direction exactly opposite the displacement of any point on said planar mounting member from the center of the circle made by said point during said circular movement of said planar mounting member.

5. Apparatus, as recited in claim 1, wherein said planar mounting member is urged toward the center of the circle made by said member during the circular movement thereof.

6. Apparatus, as recited in claim 1, wherein said heating means comprises a melted paraffin bath and means to position said circuit board for the transmission of heat from said bath to said circuit board.

7. Apparatus, as recited in claim 6, wherein said circuit board is immersed in said paraffin bath during the circular movement of said planar mounting member.

8. Apparatus, as recited in claim 6, wherein said circuit board is positioned above the surface of said paraffin bath during the circular movement of said planar mounting member.

9. Apparatus, as recited in claim 6, wherein said circuit board is located below said planar mounting member when it is in position to be heated and wherein said planar mounting member includes means for the rotation thereof into a loading and unloading position in which said circuit board is located above said planar mounting member.

10. Apparatus, as recited in claim 1, wherein said rotational motion transposing means comprises bearing sets through which said planar mounting member is mounted on said shafts, the outer race of each of said bearing sets being attached to said planar mounting member and the inner race of each of said bearing sets being attached to one of said shafts, each of said shafts being slightly displaced from the center of the respective bearing sets.

11. Apparatus, as recited in claim 1, wherein said shaft rotating means rotates said shafts at 1,000–10,000 rpm and said circular movement of said planar member describes a diameter of ¼–1/16 inches.

* * * * *